(12) United States Patent
Chen et al.

(10) Patent No.: US 8,328,378 B2
(45) Date of Patent: Dec. 11, 2012

(54) PACKAGE, LIGHT UNIFORMIZATION STRUCTURE, AND BACKLIGHT MODULE USING SAME

(75) Inventors: Jin-Jia Chen, Taichung (TW); Kai-Hung Cheng, Zhubei (TW); Kuang-Lung Huang, Dali (TW)

(73) Assignee: National Changhua University of Education, Changhua (TW)

( * ) Notice: Subject to any disclaimer, the term of this patent is extended or adjusted under 35 U.S.C. 154(b) by 239 days.

(21) Appl. No.: 12/840,282

(22) Filed: Jul. 20, 2010

(65) Prior Publication Data
US 2012/0020053 A1    Jan. 26, 2012

(51) Int. Cl.
*G09F 13/04* (2006.01)
(52) U.S. Cl. ............... 362/97.1; 362/97.2; 362/97.3
(58) Field of Classification Search ........ 362/97.1–97.4; 257/100
See application file for complete search history.

(56) References Cited

U.S. PATENT DOCUMENTS

| | | | |
|---|---|---|---|
| 7,591,567 B2 * | 9/2009 | Wilcox et al. | 362/297 |
| 2008/0273319 A1 * | 11/2008 | VanderSchuit | 362/101 |
| 2010/0128233 A1 * | 5/2010 | Liu et al. | 353/98 |
| 2010/0163921 A1 * | 7/2010 | Lin et al. | 257/99 |

* cited by examiner

*Primary Examiner* — Evan Dzierzynski
(74) *Attorney, Agent, or Firm* — Leong C. Lei (57) ABSTRACT

Provided are a package, a light uniformization structure, and a backlight module using same. The package helps improving uniformity of light and includes a multi-lateral transparent body, which has a top face and lateral faces, which are all planar surfaces. The transparent body has a bottom face in which a semispherical cavity is formed and extends inward into the body. With the package capped over a light-emitting diode with semispherical cavity set to correspond to the light-emitting diode, the light shape and the energy of light from the light-emitting diode is re-distribution and utilized by the package to thereby provide a light uniformization structure that shows high brightness, high performance, and high uniformity of light. One or a plurality of such light uniformization structures can be provided on a backlight module to enhance light uniformity for a displaying panel.

6 Claims, 8 Drawing Sheets

PACKAGE, LIGHT UNIFORMIZATION STRUCTURE, AND BACKLIGHT MODULE USING SAME

(a) TECHNICAL FIELD OF THE INVENTION

The present invention generally relates to light uniformization for a backlight module used in a display panel, and more particularly to a package having a simple structure and showing high light uniformity for application in a light uniformization structure for backlight module to make light emitting from a light-emitting diode uniformly spread and thus improving the quality of a flat panel display.

(b) DESCRIPTION OF THE PRIOR ART

The current trend of environmental conservation and the desire for high quality image displaying bring about new evolution of displaying technology, in which traditional displays that are illuminated with cold cathode fluorescent lamps that contain a component of mercury are being substituted by newly developed displays that are illuminated with backlight modules composed of light-emitting diodes (LEDs) that are advantageous in reduced power consumption, small size, high color purity, and extensive lifespan. A backlight module that is provided for a flat panel display is often composed of LEDs of various color lights, including red (R), green (G), and blue (B), that are set according to a desired arrangement to mix the color lights for generation of white light. The uniformity of the white light that is generated by mixing color lights is thus of vital importance, for it affects the lighting performance and quality of image displayed by a flat panel display.

The uniformity of light emitting from a backlight module is susceptible to influence by the thickness of the light box of the backlight module. The commonly used specifications for the thickness of the backlight modules used in flat panel displays are as follows. The thickness of the backlight module is around 25-30 mm for a 22-inch flat panel display, and the thickness is 40 mm and 60 mm respectively for 32-inch and 40-inch flat panel display. For the flat panel display products that are currently available in the market, the uniformity of white light is required to be as high as 65-75%. A backlight module that provides a white light uniformity beyond 85% is considered being of "high uniformity".

Figure 1:
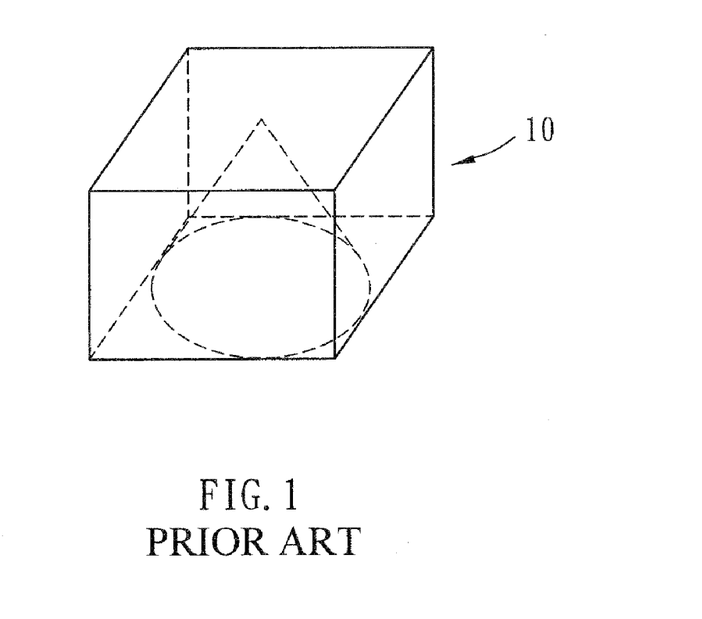
FIG. 1 is a schematic view showing a conventional package for a side-emitting light source disclosed in US Patent Application Serial No. 2006/0285311.
Figure 2:
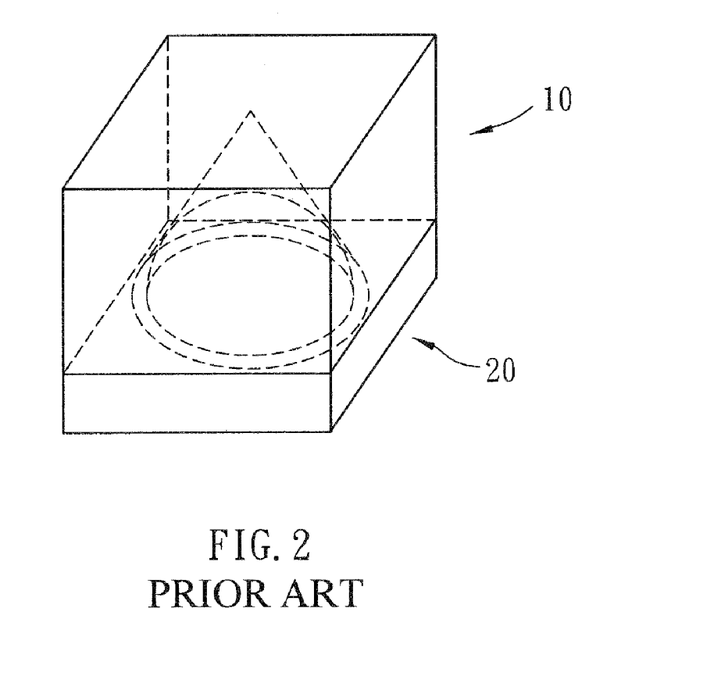
FIG. 2 is a schematic view showing mixture of light according to the conventional side-emitting light source of US Patent Application Serial No. 2006/0285311.

To improve the light uniformity of white light in mixing different color lights from LEDs of different colors, various techniques are available, such as US Patent Application Serial No. 2006/0285311, which discloses a direct type LCD (Liquid Crystal Display) backlight module, as show in FIGS. 1 and 2 of the attached drawings. The known backlight module uses an LED (20) to provide a light source. The LED (20) has a package (10), which comprises a structure having an internal symmetric conic cavity. Being capped by such a package (10), a majority of the light energy from the LED is emitted sideways from the lateral sides with only a small fraction of the light energy leaving through the top surface. With such a unique optical arrangement of the package (10), light is primarily projected into the light box of the backlight module (this being a side-emitting structure for light mixture.), so that mixture of light can be effectively carried out inside the light box. Such a known structure is concerned primarily about uniformity of light mixture, and it does not allow for overall uniform projection of the light shape and light energy of the white light generated by the whole backlight module onto the flat panel display.

Figure 3:
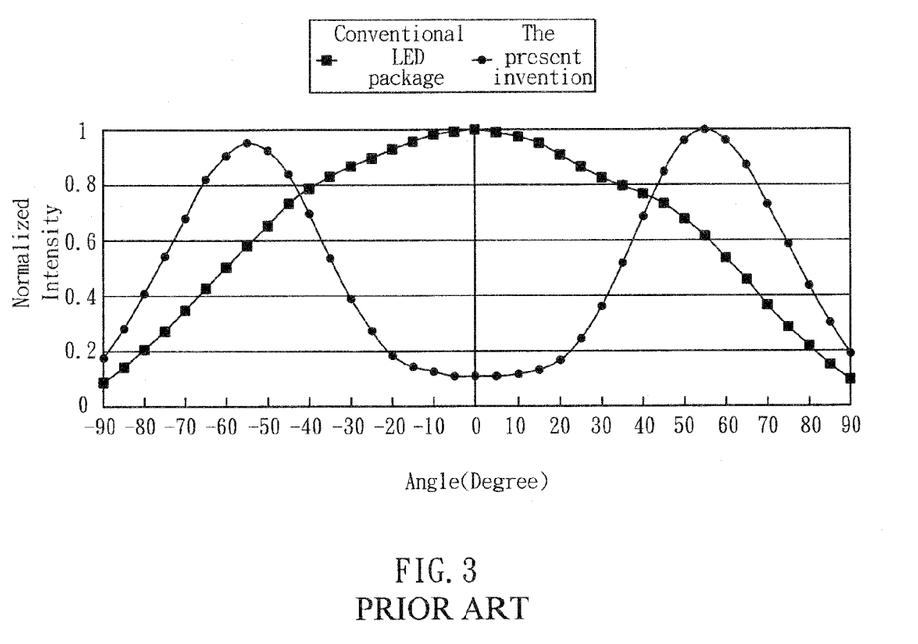
FIG. 3 shows curves of distribution of light shape according to traditional LED (square dots) and the known technology of US Patent Application Serial No. 2006/0285311 (circular dots).

A high-power LED shows a light shape that follows Lambertian distribution, as indicated by "square dots" in FIG. 3. The known package (10) comprises a hollow conic cavity for the purposes of spreading the most intense central portion of light over the periphery. This makes the light intensity reduced at the central portion, but the light of the peripheral portion become strong (as indicated by "circular dots" in FIG. 3). The purpose of significantly reducing the light intensity of the central portion is to realize effective mixture of R, G, and B lights. However, this causes deterioration of uniformity of brightness, which causes the showing of "dark spots". It is difficult for a flat panel display to show a uniformity of brightness that is beyond a predetermined level, but such a problem can be handled by increasing light emergence angle of LED, which leads to improvement of brightness uniformity and also allows for a reduction of the number of LEDs than that of a condition where the emergence angle is not increased. As a consequence, costs can be lowered down. Since the known devices cause a large amount of light concentrated at a certain location and relatively weakening light at remaining portions, it is desired to provide an improvement on light uniformity for backlight module so as to overcome such a problem.

SUMMARY OF THE INVENTION

The primary objective of the present invention is to provide a package, which is structured to allow light shape and energy of light emitting from a light-emitting diode to be re-distributed and re-utilized by the package.

Another objective of the present invention is to provide a light uniformization structure, which helps enhancing brightness, performance, and light uniformity and reducing the quantity of light-emitting diodes used.

A further objective of the present invention is to provide a backlight module, which comprises one or multiple light uniformization structures set in a predetermined arrangement in order to enhance the lighting performance and image quality of a displaying panel.

These objectives of the present invention are realized through the following technical solution, where the backlight module is composed of a plurality of light uniformization structures, each of which comprises:

a light-emitting diode; and a packaging body, which is made of a transparent material in a multi-lateral shape having a predetermined thickness, the packaging body having a top face and lateral faces, which are both planar surfaces, the packaging body having a bottom face having a center in which a semispherical cavity is defined and extends inward into the packaging body.

With the previous technical solution, the present invention allows light shape and energy of light emitting from a light-emitting diode to be re-distributed and utilized by the packaging body so as to significantly improve the brightness, performance, and uniformity of light emitting from the backlight module. Further, the emergence angle of light from the light-emitting diode is significantly increased, so that the number of light-emitting diode used is reduced and thus cost is lowered thereby increasing an added value of the invention and improving market competition power and economic advantages of the invention.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 4:
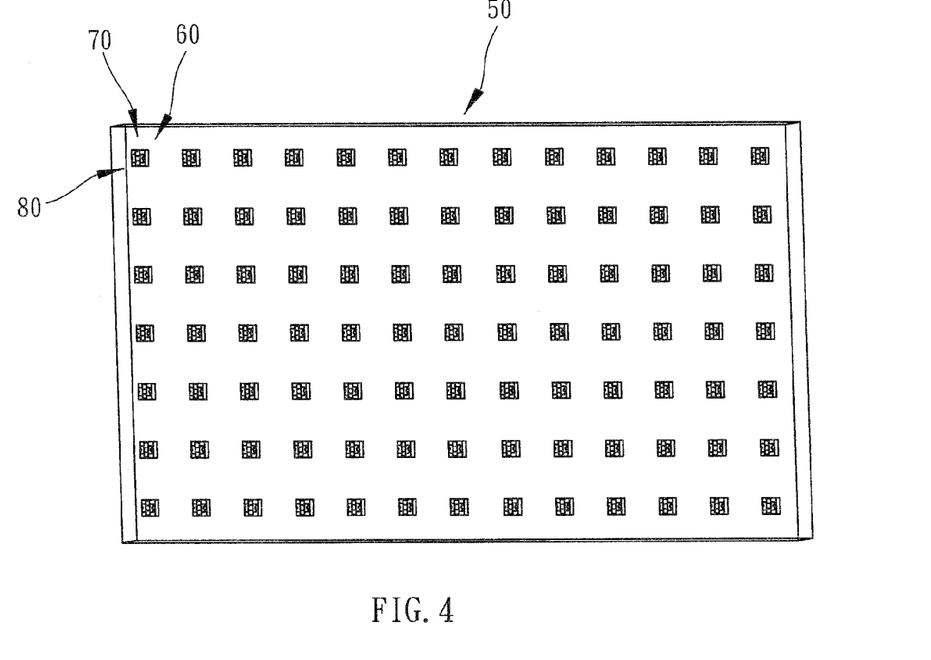
FIG. 4 is a top plan view of a backlight module according to the present invention.
Figure 5:
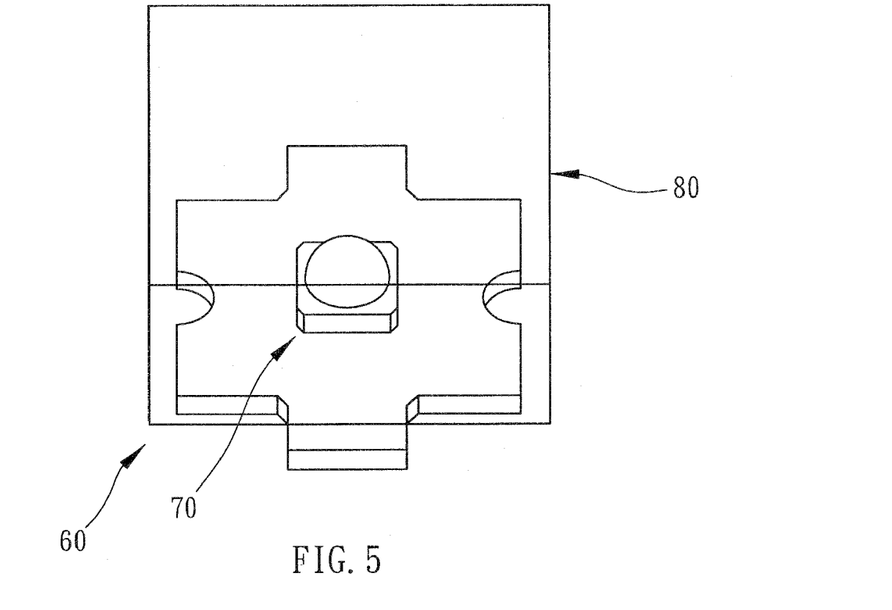
FIG. 5 is a top plan view of a light uniformization structure according to the present invention.
Figure 6:
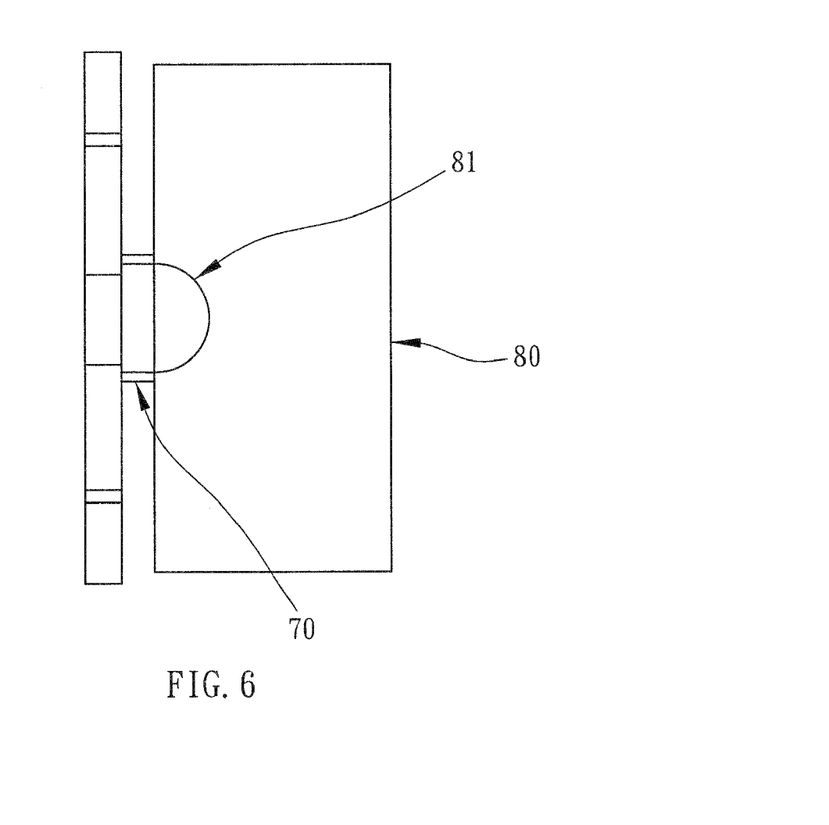
FIG. 6 is a side elevational view of the light uniformization structure according to the present invention.

Referring to FIGS. 4-6, the present invention provides a packaging body (80) applied to a light uniformization structure (60) of a backlight module (50). The backlight module (50) comprises a plurality of light uniformization structures (60) arranged in an array. Each of the light uniformization structures (60) is composed of a light-emitting diode (LED) (70) and a packaging body (80).

The light-emitting diode (70) can be a classic white light LED, which is selectively a light-emitting diode featuring physical mixture of light or chemical mixture of light.

Figure 7:
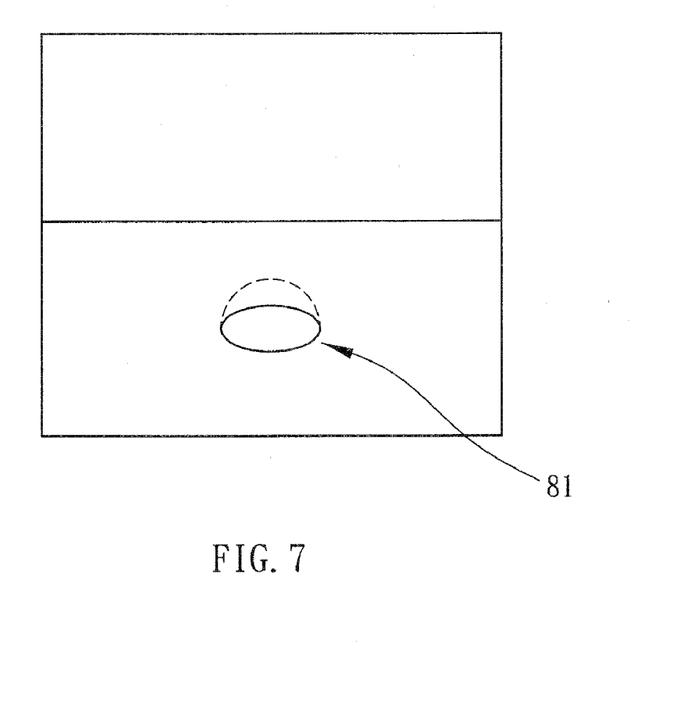
FIG. 7 is a perspective view showing a packaging body of the light uniformization structure according to the present invention.
Figure 8:
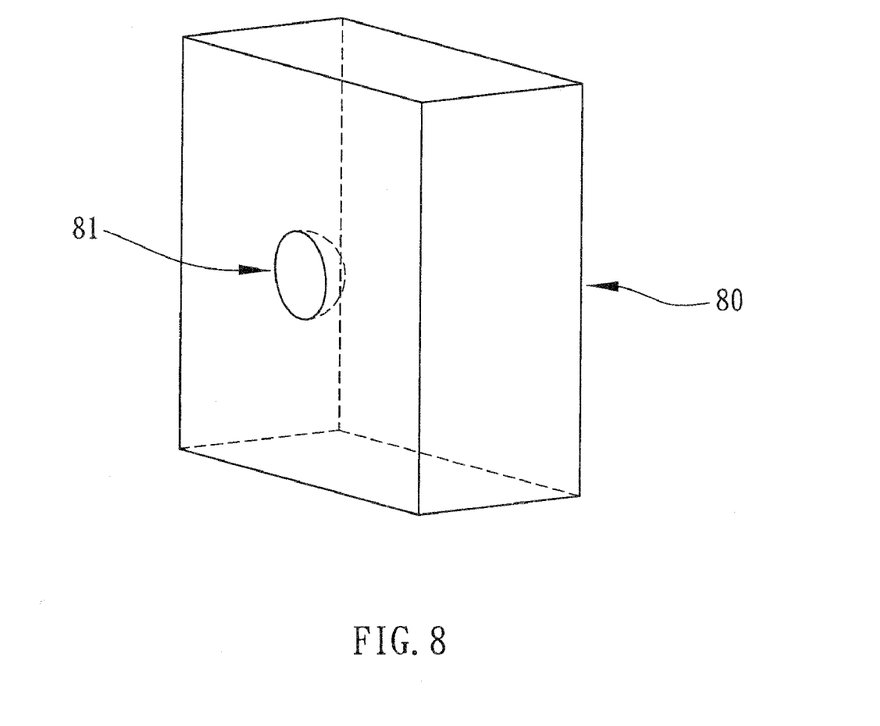
FIG. 8 is another perspective view of the packaging body of the light uniformization structure according to the present invention.

The packaging body (80) comprises a transparent body of a multi-lateral shape having a predetermined thickness. The packaging body (80) has a top face and multiple side faces, which are all planar surface. In a preferred embodiment of the present invention, the packaging body (80) takes the form of a cube. Further, the packaging body (80) has a bottom face that has a center at which a semispherical cavity (81) is formed in a direction toward a center of the cube. Reference is also made to FIGS. 6-8. The packaging body (80) is preferably made of transparent acrylic material. For such a packaging body (80) to be applied to a backlight module (50) of a 46-inch flat panel display, the packaging body (80) has a thickness of approximately 8.7-9.45 mm and a lateral dimension of approximately 15-20 mm and forms a semispherical cavity (81) having a diameter of approximately 4-4.5 mm.

The packaging body (80) is set above the light-emitting diode (70) so that the semispherical cavity (81) formed in the packaging body (80) allows the light shape and energy of the light emitting from the light-emitting diode (70) to expand in a sectorial form, and thus the light shape and energy of light exiting light uniformization structure (60) show high brightness, high performance, and high uniformity of light so as to provide a high-uniformity backlight module.

Figure 9:
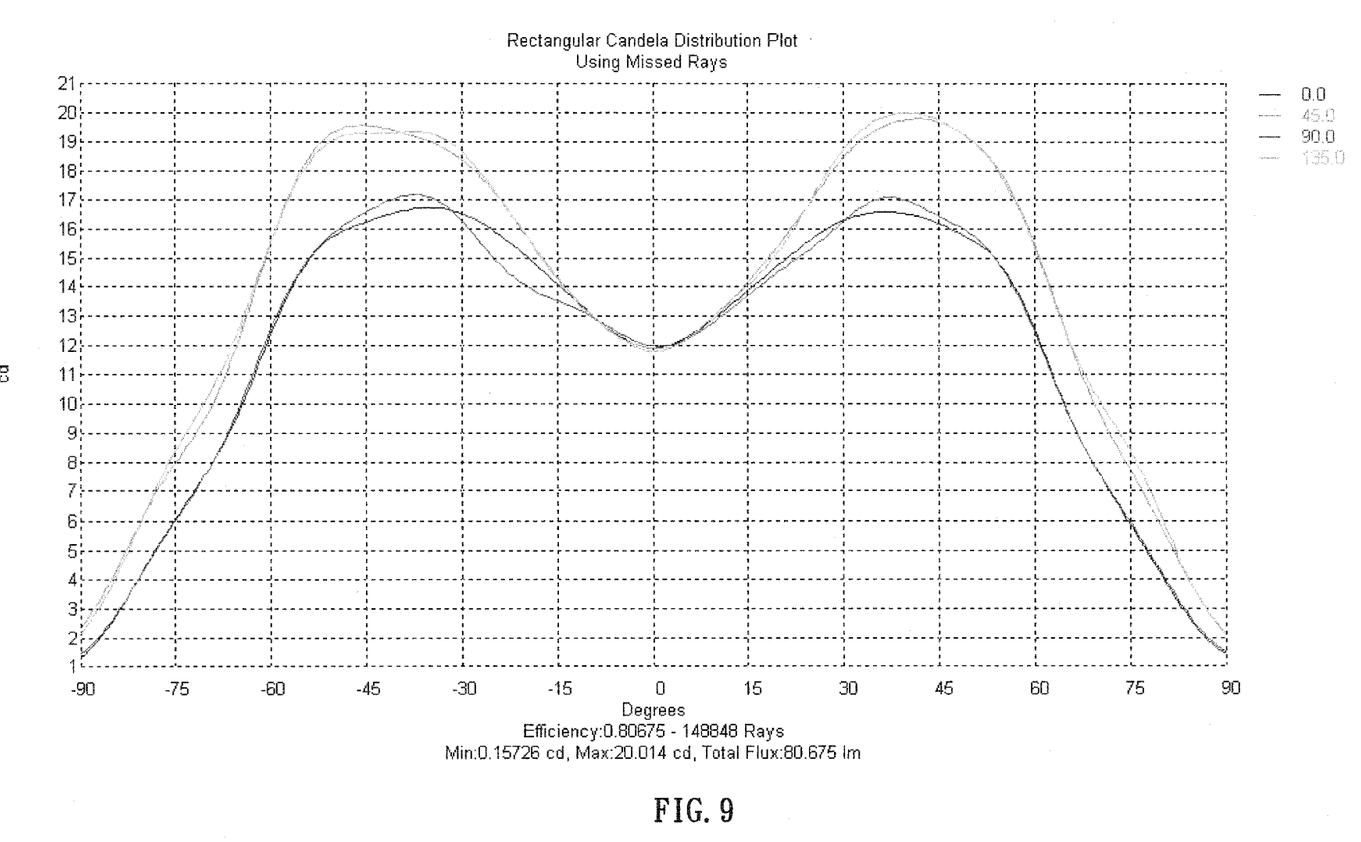
FIG. 9 shows a curve of distribution of light shape of the light uniformization structure according to the present invention.

In a practical application of the present invention, as revealed from the distribution of light shape shown in FIG. 9, due to the semispherical cavity (81) formed in the packaging body (80) to correspond to the light-emitting diode (70), the light shape of the light emitting from the light-emitting diode (70) in Lambertian distribution can travel in a sectorial form and without refraction to directly transmit into the packaging body (80), so that the light shape and energy from the light-emitting diode (70) are subjected to re-distribution and utilization through the packaging body (80). It is clearly seen from the light shape shown in FIG. 9 that compared to the extremely weak portion at the center of the curve shown in FIG. 3, which is associated with the prior art, the present invention significantly increases the strength of the central portion and thus effectively overcoming the problem of deterioration of light uniformity of the prior art.

Figure 10:
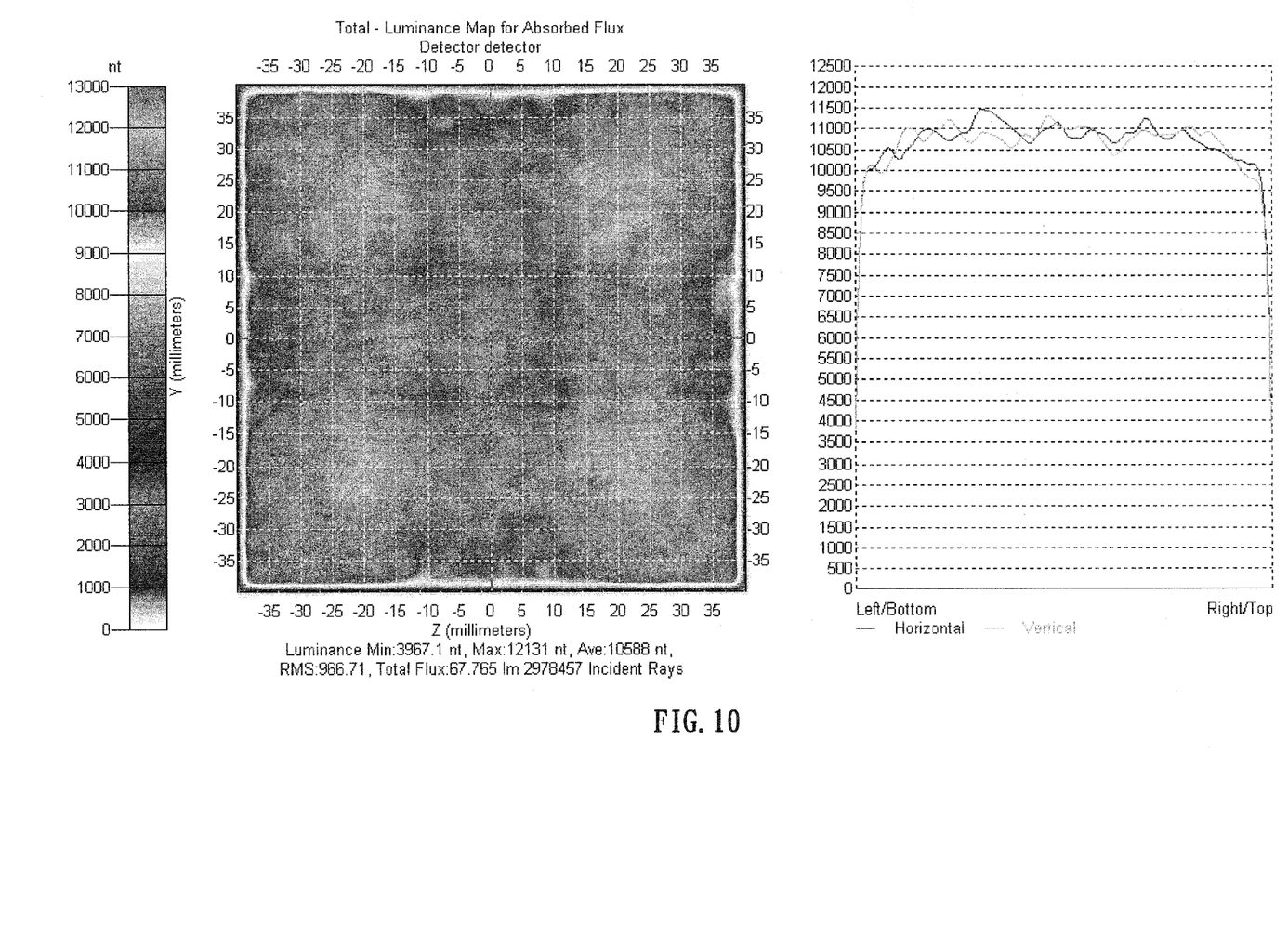
FIG. 10 shows simulation result of luminance of the light uniformization structure according to the present invention.
Figure 11:
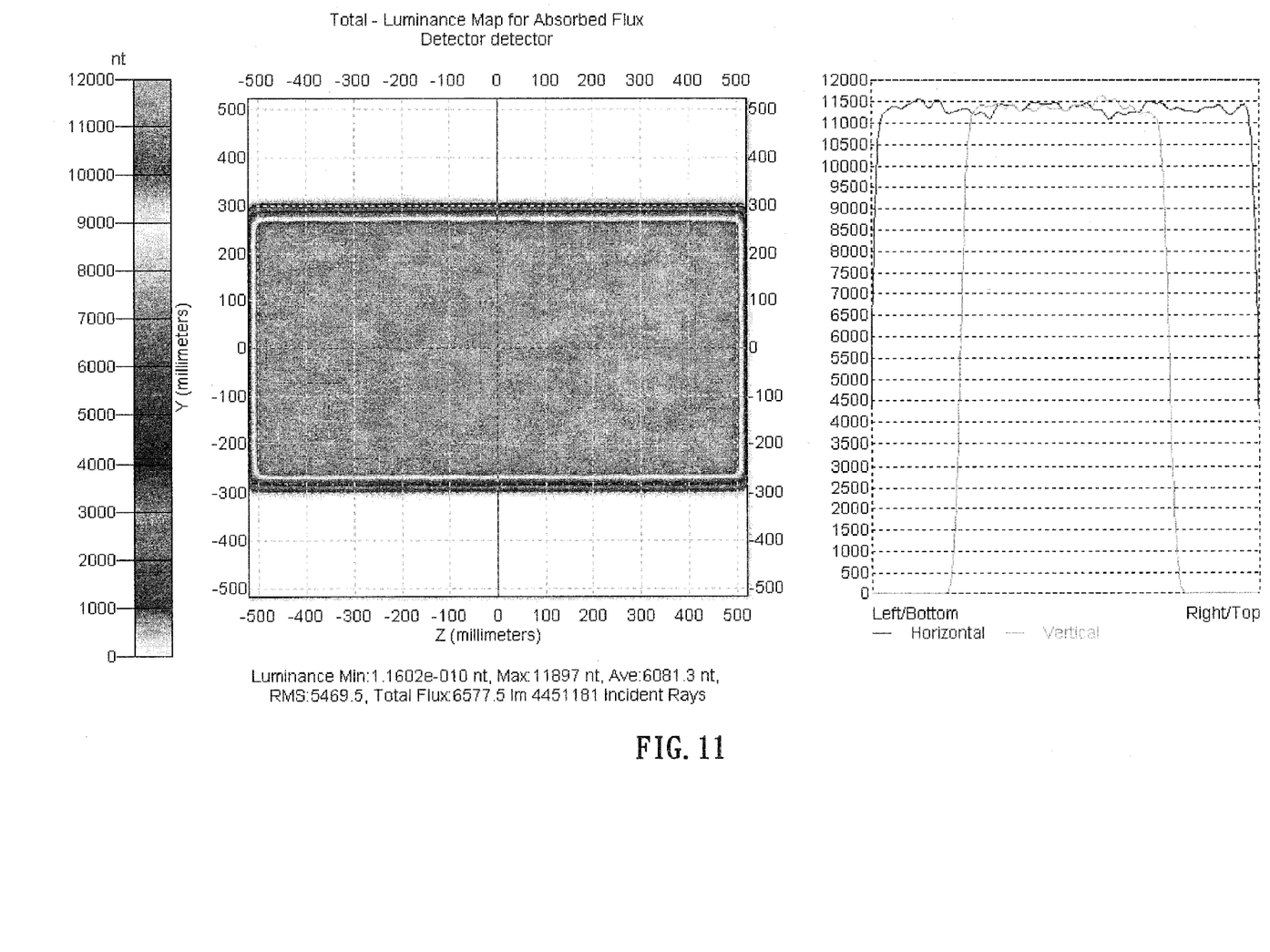
FIG. 11 shows simulation result of luminance of the backlight module according to the present invention.

FIG. 10 shows the result of simulation with the light uniformization structure (60) composed of the light-emitting diode (70) and the packaging body (80), and it reveals that light emission from the light-emitting diode (70) is affected by the semispherical cavity (81) of the packaging body (80) to transmit into the packaging body (80) in a wide-angle sectorial form of diffraction and is then subjected to light guiding and spreading effect of the packaging body (80) through successively repeated reflection inside the packaging body (80) for re-distribution and utilization. Thus, when the light emits outward in an upward direction and sideway directions through the planar surfaces of the top face and the lateral faces of the packaging body (80), the light shows an increased emergence angle. With further reference to the luminance distribution curve and light shape curve, it is clearly shown that the area of the light source is effectively expanded. As further shown in FIG. 11, by arranging a plurality of light uniformization structures (60) in a rectangular array to form a backlight module (50) according to the present invention, the light shape and energy emitting from the light-emitting diodes (70) of the backlight module (50) can be distributed and utilized in a more uniform manner thereby providing a backlight module (50) showing high brightness, high performance, and high light uniformity. Since the emergence angle of light from the light-emitting diode (70) is increased, the number of light-emitting diode (70) used can be reduced, making it possible to reduce costs.

The light uniformization structure (60) of the backlight module (50) according to the present invention provides a high light uniformity (which according to the result of simulation mentioned above, is higher than 90%), high luminance, and a reduced thickness, (where the thickness of the backlight module is for example 40 mm), whereby a flat panel display of excellent quality is realized.

Figure 12:
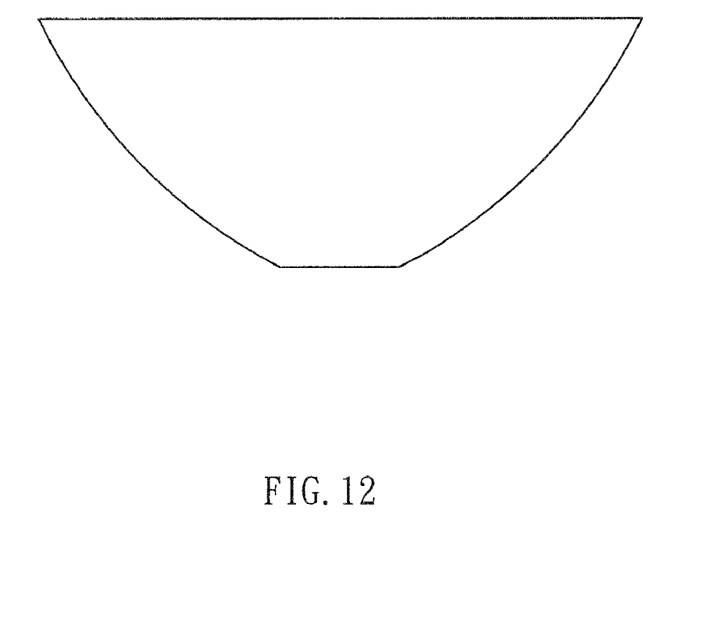
FIG. 12 is a side elevational view of a multi-lateral parabolic reflection hood according to the present invention.
Figure 13:
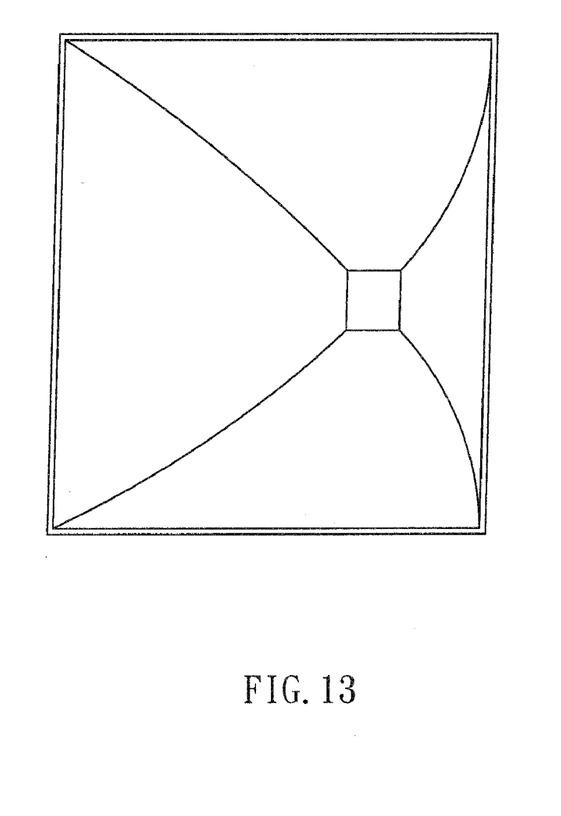
FIG. 13 is a top plan view of the multi-lateral parabolic reflection hood according to the present invention.

Further, according to another embodiment of the present invention for the light uniformization structure (60), when the lighting box of the backlight module (50) is of an ultra-thin thickness, a parabolic reflection hood, which has a multi-lateral shape having an upward-facing opening, as show in FIGS. 12 and 13, is selectively mounted to each packaging body (80), whereby the light uniformization structure (60) may use the total reflection performed by the reflection hood, which help uniformizing light, and the surrounding provided by the reflection hood to further uniformize the light from the light-emitting diode (70) and thus improving the lighting performance thereof.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A backlight module using a light uniformization structure, wherein:
    said light uniformization structure comprising:
        a light-emitting diode; and
        a packaging body, which is made of a transparent material in a multi-lateral shape having a predetermined thickness, the packaging body having a top face and lateral faces, which are both planar surfaces, the packaging body having a bottom face having a center in which a semispherical cavity is defined and extends inward into the packaging body;
    said backlight module comprising a plurality of light uniformization structures set up in a predetermined arrangement and each comprising:
        a light-emitting diode; and
        a packaging body, which is made of a transparent material in a multi-lateral shape having a predetermined thickness, the packaging body having a top face and lateral faces, which are both planar surfaces, the packaging body having a bottom face having a center in which a semispherical cavity is defined and extends inward into the packaging body.

2. The backlight module according to claim 1, wherein the light-emitting diode is selected from a group consisting of white-light light-emitting diode and light-emitting diode of physical or chemical mixture of light.

3. The backlight module according to claim 1, wherein the packaging body comprises a cubic body.

4. The backlight module according to claim 1, wherein the packaging body is made of acrylic material.

5. The backlight module according to claim 1, further comprising a multi-lateral parabolic reflection hood mounted to the light uniformization structure.

6. The backlight module according to claim 1, wherein the backlight module is of a size of 46 inches and the packaging body has a thickness of approximately 8.7-9.45 mm and a lateral dimension of approximately 15-20 mm and the semispherical cavity has a diameter of approximately 4-4.5 mm.

* * * * *